US008810268B2

(12) United States Patent
Huang et al.

(10) Patent No.: US 8,810,268 B2
(45) Date of Patent: Aug. 19, 2014

(54) BUILT-IN SELF-TEST CIRCUIT FOR LIQUID CRYSTAL DISPLAY SOURCE DRIVER

(75) Inventors: Jui-Cheng Huang, Hsinchu (TW); Yung-Chow Peng, Hsinchu (TW); Ruey-Bin Sheen, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 469 days.

(21) Appl. No.: 12/764,346

(22) Filed: Apr. 21, 2010

(65) Prior Publication Data

US 2011/0260746 A1 Oct. 27, 2011

(51) Int. Cl.
*G01R 31/3187* (2006.01)

(52) U.S. Cl.
USPC .............. 324/750.3; 324/760.01; 324/760.02; 324/763.01; 324/763.02; 345/93; 345/98; 345/100; 345/204

(58) Field of Classification Search
USPC ............... 324/750.3, 760.01–760.02, 762.01, 324/763.01–763.02; 345/93, 98–100, 204
See application file for complete search history.

(56) References Cited

U.S. PATENT DOCUMENTS

| | | | | |
|---|---|---|---|---|
| 6,008,801 | A * | 12/1999 | Jeong | 345/204 |
| 6,191,770 | B1 * | 2/2001 | Kim | 345/100 |
| 6,750,839 | B1 * | 6/2004 | Hogan | 345/98 |
| 6,856,161 | B2 * | 2/2005 | Thewes | 324/750.3 |
| 7,199,575 | B2 * | 4/2007 | Chen et al. | 324/750.3 |
| 7,221,170 | B2 * | 5/2007 | Lee et al. | 324/713 |
| 7,432,904 | B2 * | 10/2008 | Kang | 345/98 |
| 7,474,290 | B2 * | 1/2009 | Makuuchi et al. | 345/87 |
| 7,903,106 | B2 * | 3/2011 | Lan | 345/211 |
| 7,915,906 | B2 * | 3/2011 | Hashimoto | 324/760.01 |
| 8,124,429 | B2 * | 2/2012 | Norman | 438/17 |
| 8,217,923 | B2 * | 7/2012 | Matsui | 345/204 |
| 8,432,180 | B2 * | 4/2013 | Burns et al. | 324/762.01 |
| 8,477,123 | B2 * | 7/2013 | Tomohiro et al. | 345/204 |
| 8,482,502 | B2 * | 7/2013 | Kim et al. | 345/92 |
| 8,537,092 | B2 * | 9/2013 | Woo et al. | 345/98 |
| 2005/0162374 | A1 * | 7/2005 | Kim et al. | 345/100 |
| 2008/0094385 | A1 * | 4/2008 | Tazuke | 345/211 |
| 2011/0254822 | A1 * | 10/2011 | Anzai et al. | 345/211 |

FOREIGN PATENT DOCUMENTS

JP 2006-119225 5/2006

OTHER PUBLICATIONS

Watanabe, A., et al., "High Precision Testing Method of Mixed Signal Device", Testing Technology Section, Development Promotion, Microcomputer Division, Business Group-1, Matsushita Electronics, 1994, IEEE, pp. 1284-1288.

* cited by examiner

*Primary Examiner* — Tung X Nguyen
*Assistant Examiner* — Thang Le
(74) *Attorney, Agent, or Firm* — Lowe Hauptman & Ham, LLP

(57) ABSTRACT

A built-in self-test (BIST) circuit for a liquid crystal display (LCD) source driver includes at least one digital-to-analog converter (DAC) and at least one buffer coupled to the respective DAC, wherein the buffer is reconfigurable as a comparator. A first input signal and a second input signal are coupled to the comparator. The first input signal is a predetermined reference voltage level. The second input signal is a test offset voltage in a test range.

20 Claims, 6 Drawing Sheets

BUILT-IN SELF-TEST CIRCUIT FOR LIQUID CRYSTAL DISPLAY SOURCE DRIVER

TECHNICAL FIELD

The present disclosure relates generally to integrated circuits, more particularly to built-in self-test (BIST) circuits for liquid crystal display (LCD) source driver.

BACKGROUND

A LCD source driver can have many channels, e.g., 256-1024. The channel-to-channel offset voltage variation is expected to be limited to certain voltage values, e.g., less than +/−5 mV. The channel-to-channel offset voltage variations are tested using various test methods.

Conventional testers for the LCD source driver have drawbacks including increasing testing cost as more channels are tested, or as more accurate analog-to-digital converters (ADC) are used. It is very expensive to use a special mixed-mode (e.g., analog and digital) tester with high-resolution for better accuracy and high pin counts for more channels. Also, testers using a multiplexing switch to share an ADC for the testing require an expensive multiplexing switch, and the testing time is very long, which will increase the testing cost and throughput.

Accordingly, new circuits and methods are desired to solve the above problems.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

Figure 1:
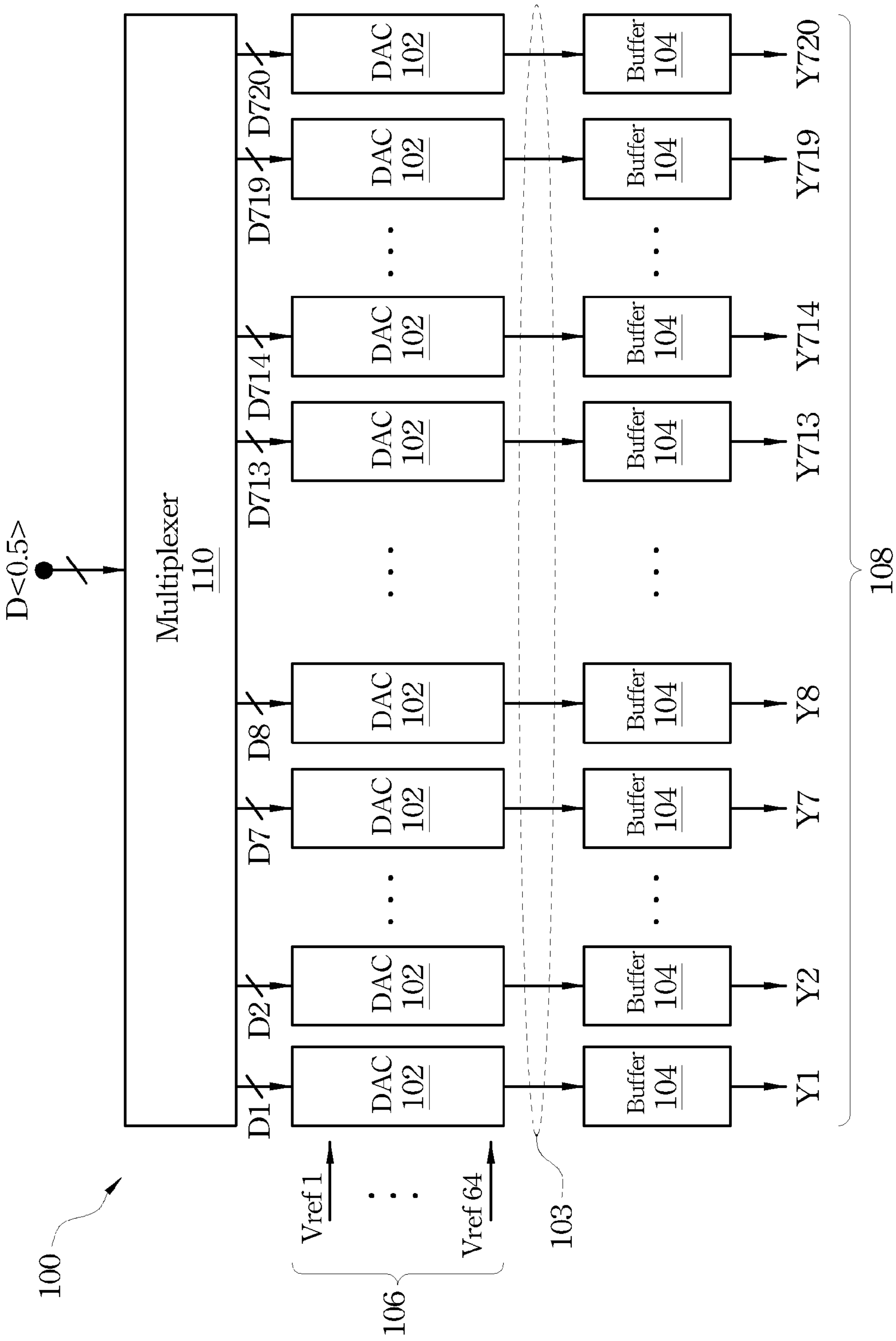
FIG. 1 is a schematic diagram showing an example of a liquid crystal display (LCD) source driver in a normal operation mode that can be reconfigured for self-tests according to some embodiments.

FIG. 1 is a schematic diagram showing an example of a liquid crystal display (LCD) source driver in a normal operation mode that can be reconfigured for self-tests according to some embodiments. In the embodiment of FIG. 1, the source driver 100 includes 720 channels corresponding to 720 channel outputs 108 (e.g., Y1, Y2, . . . , Y720). A digital code input (6 bits) D<0:5> that changes over time is time-multiplexed for each channel output 108 (e.g., Y1, Y2, . . . , Y720) through the multiplexer 110. That is, each output of the multiplexer 110 (e.g., D1, D2, . . . , D720) is coupled to each corresponding digital-to-analog converter (DAC) 102 at different times (i.e., time multiplexed) from D<0:5>. Each multiplexer output (e.g., D1, D2, . . . , D720) is used by the corresponding DAC 102 for choosing one from 64 DAC reference values 106 (e.g., Vref 1, Vref 2, . . . , Vref 64) for each DAC 102's output 103. The DACs 102 are coupled to buffers 104 that provide the channel outputs 108 (e.g., Y1, Y2, . . . , Y720), which are also the source driver outputs for driving the LCD pixels.

In some embodiments, the 64 DAC reference values 106 are uniformly distributed over a certain voltage range, e.g., 0 V-9 V, or 9 V-18 V. For example, [Vref 1, Vref 2, . . . , Vref 63, Vref 64]=[9/64, 2*9/64, . . . , 63*9/64, 9] V, or [9+9/64, 9+2*9/64, . . . , 9+63*9/64, 18] V. The DAC output 103 are selected from the DAC reference values 106 (Vref 1, Vref 2, . . . , Vref 64) based on the digital code D<0:5> for each channel output 108. The number of bits of the digital code is not limited to 6 bits, and therefore, the number of DAC reference values 106 is not limited to 64.

Figure 2:
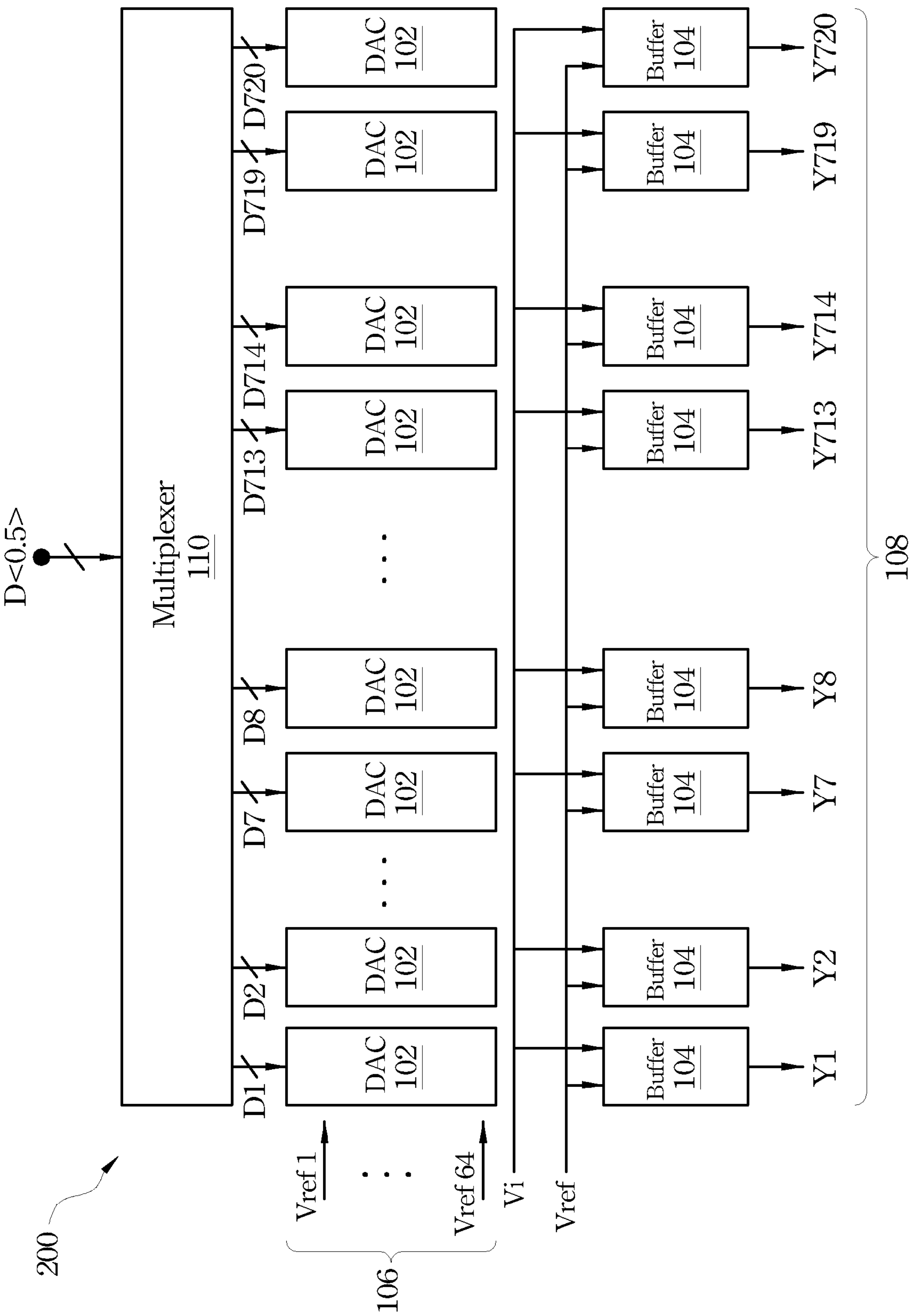
FIG. 2 is a schematic diagram showing the liquid crystal display (LCD) source driver of FIG. 1 in a first self-test mode according to some embodiments.

FIG. 2 is a schematic diagram showing the liquid crystal display (LCD) source driver of FIG. 1 in a first self-test mode according to some embodiments. The first self-test can be initiated by a control input (not shown) to the circuit 200 and the first self-test is a built-in self-test (BIST). In some embodiments, the BIST does not involve external testing devices, but rather processed within the integrated circuit including the circuit 200 under test. In some other embodiments, the BIST may involve external signals supplied to the circuit 200 under test, e.g., Vi and/or Vref.

In the first self-test mode, the buffers 104 are disconnected from the DACs 102. Instead, input signals Vi and Vref are supplied to the buffers 104. In some embodiments, a control signal can be used to disconnect the buffers 104 from the DACs 102 through a switch, e.g., a transistor. The Vi and Vref are input signals for testing: Vi is a test voltage and Vref is a test reference voltage for comparison with Vi. Vref can be one of the DAC reference values 106, e.g., Vref 1, Vref 2, . . . , Vref 64. In some embodiments, each buffer 104 is reconfigured as a comparator.

Figure 3:
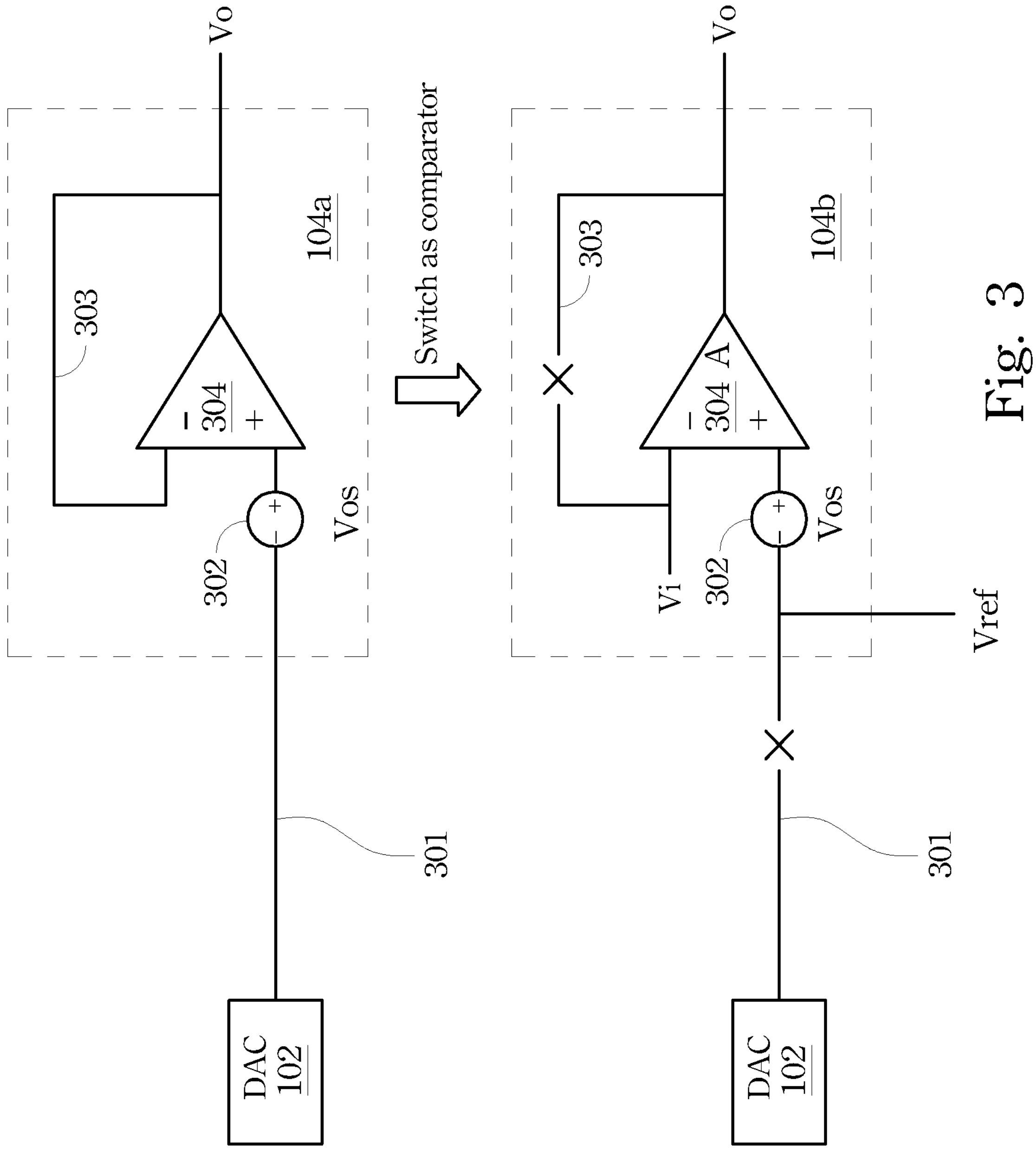
FIG. 3 is a schematic diagram showing exemplary reconfigurations of the buffer 104 of FIG. 2 for the first self-test mode according to some embodiments.

FIG. 3 is a schematic diagram showing exemplary reconfiguration of the buffer 104 of FIG. 2 for the first self-test mode according to some embodiments. In FIG. 3, a buffer 104*a*, an embodiment of the buffer 104 in FIG. 2, is implemented using an operational amplifier (op-amp) 304. The buffer 104*a* is in a normal operation mode of the LCD source driver. The op-amp 304's non-inverting input (e.g., the positive (+) terminal) has an offset voltage Vos 302 and is coupled to the DAC 102, while the op-amp output Vo is feedback to the inverting input (e.g., the negative (−) terminal). Vos 302 is the voltage difference between the op-amp 304's inverting input and non-inverting input. In some embodiments, the op-amp 304 is a unity-gain buffer with high input impedance and low output impedance.

In the first self-test mode, the buffer 104*a* is reconfigured as a comparator 104*b* to test the Vos (the op-amp 304's offset voltage between the inverting input and non-inverting input), e.g., to verify that it is within an acceptable range. The inverting input of the op-amp 304 is disconnected from Vo (i.e., the feedback loop connection 303 is broken), and is instead coupled to Vi. Also, the non-inverting input is disconnected from DAC 102 (i.e., the connection 301 is broken), and is instead coupled to Vref. In some embodiments, a control signal can be used to control the disconnections and/or connections between the DAC 102 and the op-amp 304 through a switch, e.g., a transistor (not shown). In other embodiments, another control signal can be used to control the disconnection and/or connections of the feedback loop connection 303 through another switch, e.g., a transistor (not shown).

For illustration, the DAC 102's output voltage (Vdac) at the connection 301 is 9 V, and Vref is set to 9 V. Therefore, if Vos=0.005 V, Vo=Vdac+Vos=9.005 V in the normal mode (i.e., from the unity gain buffer 104*a*.). However, in the self-test mode (i.e., from the comparator 104*b*), $$Vo=A*(Vref+Vos-Vi), \qquad \text{Equation (1)}$$

where A is the op-amp gain, e.g., 10000, in some embodiments. In order to decide whether the op-amp's offset voltage Vos is within a given specification, e.g., within a specified range of +/−5 mV, Vi is set as the reference voltage Vref, e.g., 9 V, plus a test offset voltage at the maximum/minimum Vos values (e.g., +5 mV and −5 mV).

To test the Vos upper bound or whether Vos is below the maximum specification (i.e., Vos<Vos_max) with Vos_max=5 mV, Vi can be set to Vref+Vos_max=9 V+0.005 V=9.005 V in one example. If the actual Vos is less than 5 mV, e.g., 4.9 mV, Vo=10000*(9+0.0049−9.005)=10000*(−0.0001)=−1V from Equation (1). And for Vos<4.9 mV, Vo<−1 V. If Vos is greater than 5 mV, e.g., 5.1 mV, Vo=10000*(9+0.0051−9.005)=10000* (0.0001)=1V from Equation (1). And for Vos>5.1 mV, Vo>1 V. Thus, by detecting whether Vo is a low logical value (e.g., −1 V or lower) or a high logical value (e.g., 1 V or higher), it can be determined whether Vos is below the maximum specification (e.g., less than 5 mV) to pass the test; or Vos is above the maximum specification (e.g., greater than 5 mV) to fail the test, respectively. In this example, Vo can be compared to a 0 V to determine pass or fail, or a threshold value, e.g., +1 V or −1 V, can be used for comparison to determine pass or fail.

To test the Vos lower bound or whether Vos is above the minimum specification (i.e., Vos>Vos_min) with Vos_min=−5 mV, Vi can be set to Vref+Vos_min=9 V−0.005 V=8.995 V in one example. If the actual Vos is higher than −5 mV, e.g., −4.9 mV, Vo=10000*(9−0.0049−8.995)=10000*(0.0001)=1V from Equation (1). And for Vos>−4.9 mV, Vo>1 V. If Vos is less than −5 mV, e.g., −5.1 mV, Vo=10000*(9−0.0051−8.995)=10000*(−0.0001)=−1V from Equation (1). And for Vos<−5.1 mV, Vo<−1 V. Thus, by detecting whether Vo is a high logical value (e.g., 1 V or higher) or a low logical value (e.g., −1 V or lower), it can be determined whether Vos is above the minimum specification (e.g., greater than −5 mV) to pass the test, or Vos is below the minimum specification (e.g., less than −5 mV) to fail the test, respectively. In this example, Vo can be compared to a 0 V to determine pass or fail, or a threshold value, e.g., +1 V or −1 V, can be used for comparison to determined pass or fail.

If the tests of Vos for both upper bound and lower bound pass, then the Vos specification is verified. Otherwise, the test fails the Vos specification. The test is performed for all channels, e.g., Y1, Y2, . . . , Y720. In some embodiments, the test offset voltage value can be swept from a minimum test value (e.g., the low bound) to the maximum test value (e.g., the upper bound) at a fixed voltage step, e.g., −5 mV, −4.9 mV, −4.8 mV, . . . , −0.1 mV, 0 V, 0.1 mV, . . . , 4.8 mV, 4.9 mV, 5 mV.

Figure 4:
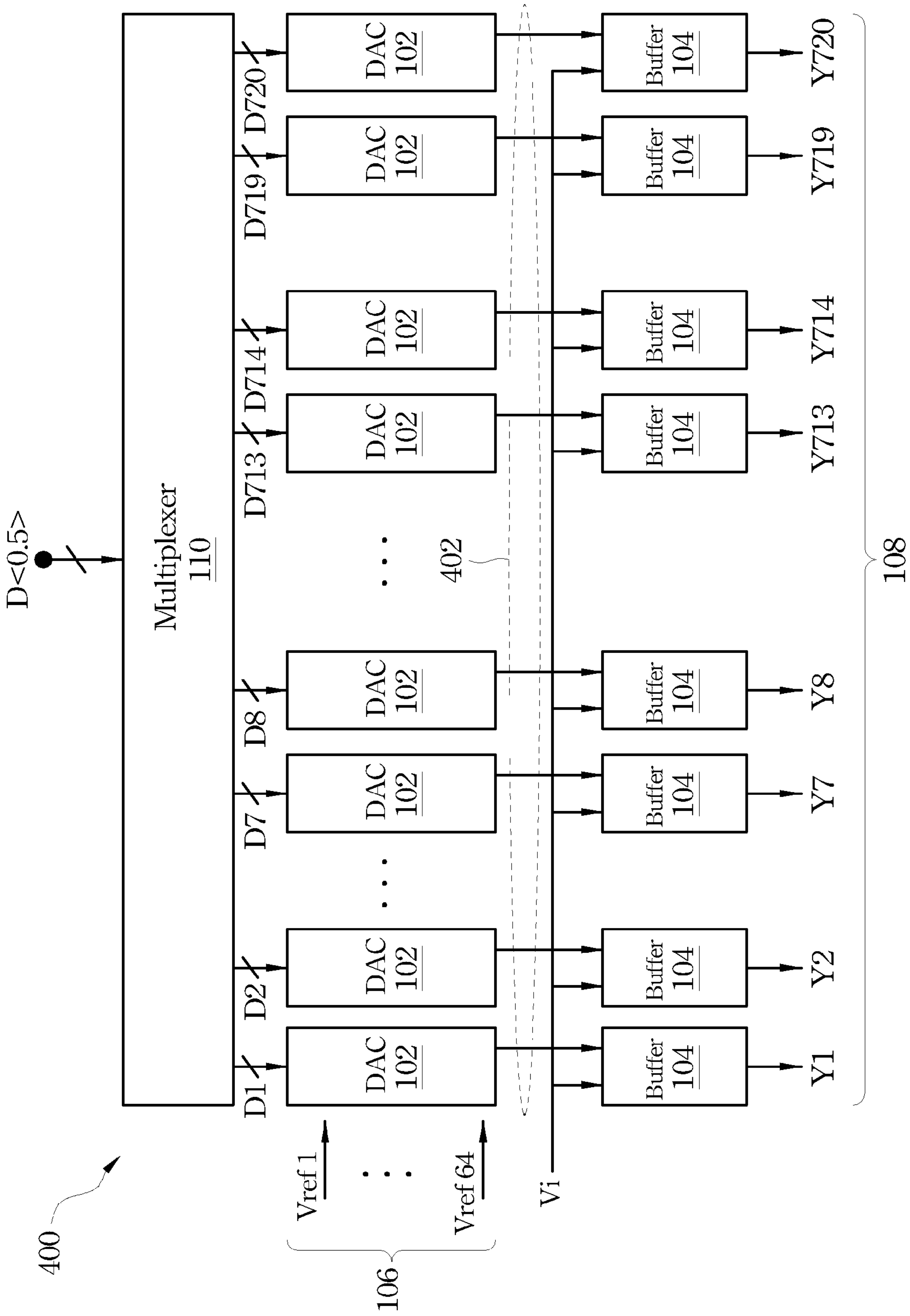
FIG. 4 is a schematic diagram showing the liquid crystal display (LCD) source driver of FIG. 1 in a second self-test mode according to some embodiments.

FIG. 4 is a schematic diagram showing the liquid crystal display (LCD) source driver of FIG. 1 in a second self-test mode according to some embodiments. The second self-test can be initiated by a control input (not shown) to the circuit 400, and the self-test is a built-in self-test because it does not involve external testing devices, but rather processed within the integrated circuit including the circuit 400 that is under the test. In FIG. 4, the buffers 104 are still connected to the DAC 102. In addition, a test voltage V1 is supplied to the buffers 104 as an input signal. The DAC 102 output 402 coupled to the buffer 104 is set at a test reference voltage Vref, one of the DAC reference values 106, e.g., Vref 1, Vref 2, . . . , Vref 64. The buffer 104 is reconfigured as a comparator for the second self-test mode.

Figure 5:
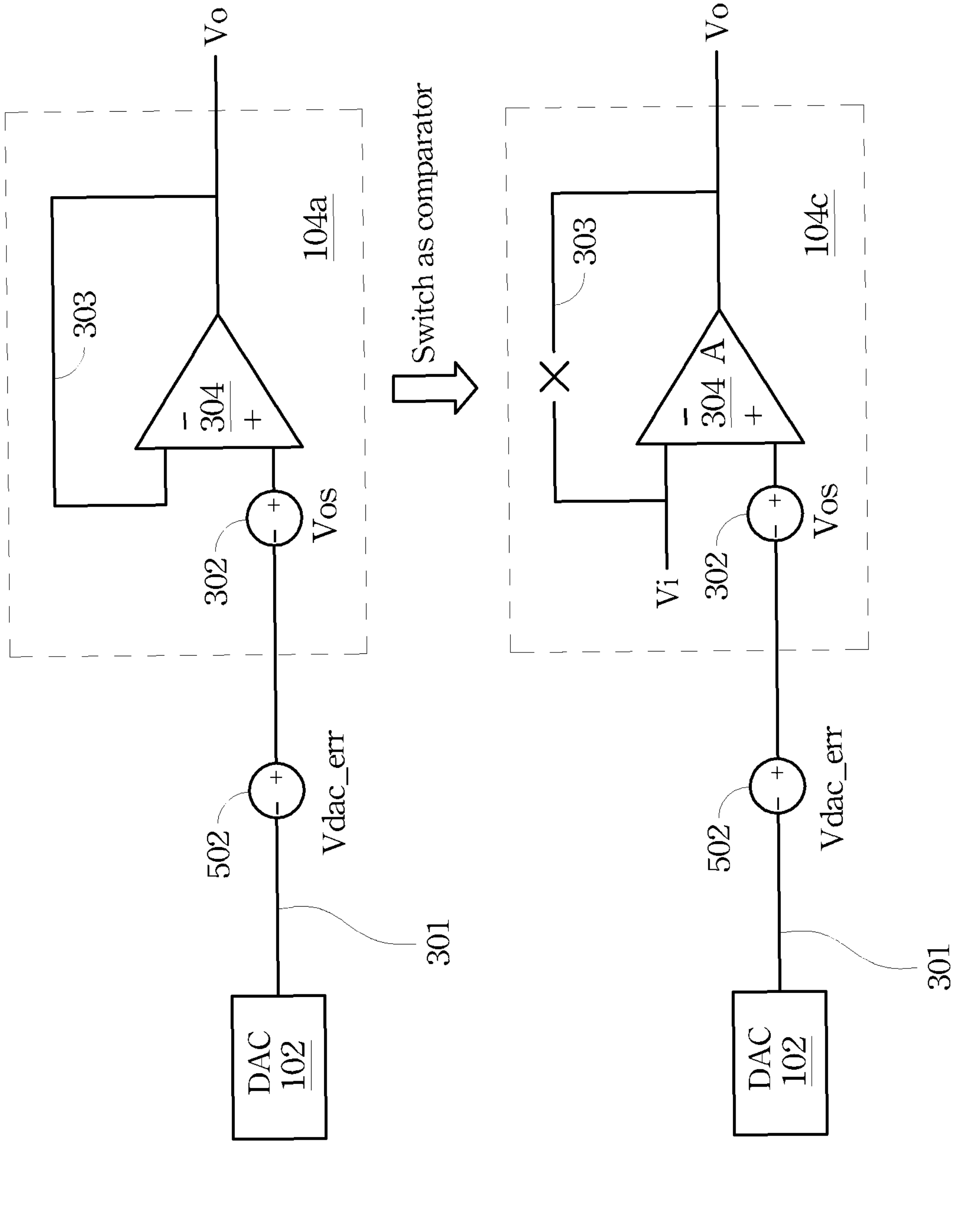
FIG. 5 is a schematic diagram showing exemplary reconfigurations of the buffer 104 of FIG. 4 for the second self-test mode according to some embodiments.

FIG. 5 is a schematic diagram showing exemplary reconfiguration of the buffer 104 of FIG. 4 for the second self-test mode according to some embodiments. In FIG. 5, a DAC 102 is shown with a DAC error voltage Vdac_err 502. Even though Vdac_err 502 is from within the DAC 102, it is shown separately in FIG. 5 to indicate that Vdac_err 502 is tested. The second self-test can be performed to test the DAC 102 accuracy after Vos is tested in the first self-test. The second self-test can be also performed to test the combined specification of (Vdac_err+Vos).

The buffer 104*a* is implemented using an operational amplifier (op-amp) 304. The buffer 104*a* is in a normal operation mode of the LCD source driver. The op-amp 304's non-inverting input has an offset voltage Vos 302 and is coupled to the DAC 102, while the op-amp output Vo is feedback to the inverting input. The op-amp 304 is a unity-gain buffer with high input impedance and low output impedance.

In the second self-test mode, the buffer 104*a* is reconfigured as a comparator 104*c* to test the DAC 102's error voltage, i.e., Vdac_err 502, in addition to the random offset Vos. The non-inverting input is still connected from DAC 102 (i.e., the connection 301 is not broken) to test the DAC 102's error voltage, i.e., Vdac_err 502. The inverting input of the op-amp 304 is disconnected from Vo (i.e., the feedback loop connection 303 is broken), and instead coupled to Vi. In some embodiments, a control signal can be used to for the disconnection and/or connection through a switch, e.g., a transistor.

For illustration, the DAC 102's output voltage (Vdac) at 301 is Vref=9 V. If Vos (i.e., the op-amp 304's offset voltage)=0.005 V and Vdac_err (i.e., the DAC 102's error voltage)=0.005 V, Vo=Vdac+Vdac_err+Vos=9.010 V in the normal mode (i.e., from the unity gain buffer 104*a*.). However, in the second self-test mode (i.e., from the comparator 104*c*), $$Vo=A*(Vref+Vdac\_err+Vos-Vi), \qquad \text{Equation (2)}$$

where A is the op-amp gain, e.g., 10000.

In order to decide whether (Vdac_err+Vos) is within a given specification, e.g., +/−5 mV for both Vdac_err and Vos, Vi is set as the reference voltage Vref, e.g., 9 V, plus the maximum/minimum value of the specification for (Vdac_err+Vos), e.g., 10 mV or −10 mV. The procedures of the second self-test by the comparator 104*c* is similar to the first self-test by the comparator 104*b* shown in FIG. 3, except that the tested voltage is (Vdac_err+Vos) in the second self-test, instead of Vos in the first self-test.

For example, to test the upper bound of (Vdac_err+Vos), Vref can be set to 9 V, and Vi=9 V+10 mV, for Vdac_err and Vos specification of +/−5 mV. In that case, Vo=10000*(9 V+Vdac_err+Vos−9 V−10 mv)=10000*(Vdac_err+Vos−10 mv) from Equation (2). Therefore, if Vdac_err+Vos=9.9 mv, Vo=−1V, and for Vdac_err+Vos<9.9 mv, Vo<−1V, to pass the test. If Vdac_err+Vos=10.1 mv, Vo=1V, and for Vdac_err+Vos>10.1 mv, Vo>1V to fail the test.

To test the lower bound of (Vdac_err+Vos), Vref can be set to 9 V, and Vi=9 V-10 mV, for Vdac_err and Vos specification of +/−5 mV. In that case, Vo=10000*(9 V+Vdac_err+Vos−9 V+10 mv)=10000*(Vdac_err+Vos+10 mv) from Equation (2). Therefore, if Vdac_err+Vos=−9.9 mv, Vo=1V, and for Vdac_err+Vos>−9.9 mv, Vo>1V, to pass the test. If Vdac_err+Vos=−10.1 mv, Vo=−1V, and for Vdac_err+Vos<−10.1 mv, Vo<−1V, to fail the test.

If both the upper bound and lower bound tests pass, then DAC 102 accuracy with the buffer 104*a* meets the specification of +/−10 mV. In this example, Vo can be compared to a 0 V to determine pass or fail, or a threshold value, e.g., +1 V or −1 V, can be used for comparison to determined pass or fail. The test is performed for all channels, e.g., Y1, Y2, . . . , Y720. In embodiments, the test offset voltage (Vdac_err+Vos) can be swept from a minimum test value to the maximum test value at a fixed voltage step, e.g., −10 mV, −9.9 mV, −9.8 mV, . . . , −0.1 mV, 0 V, 0.1 mV, . . . , 9.8 mV, 9.9 mV, 10 mV.

Some embodiments provide very fast and efficient self-tests of the LCD source driver for mass production at relatively low costs. The tests described under FIG. 3 and/or FIG. 5 utilize only a logic tester (e.g., to determine whether the Vo level passes or fails the test), instead of using a mixed-mode tester including an analog circuit.

Figure 6:
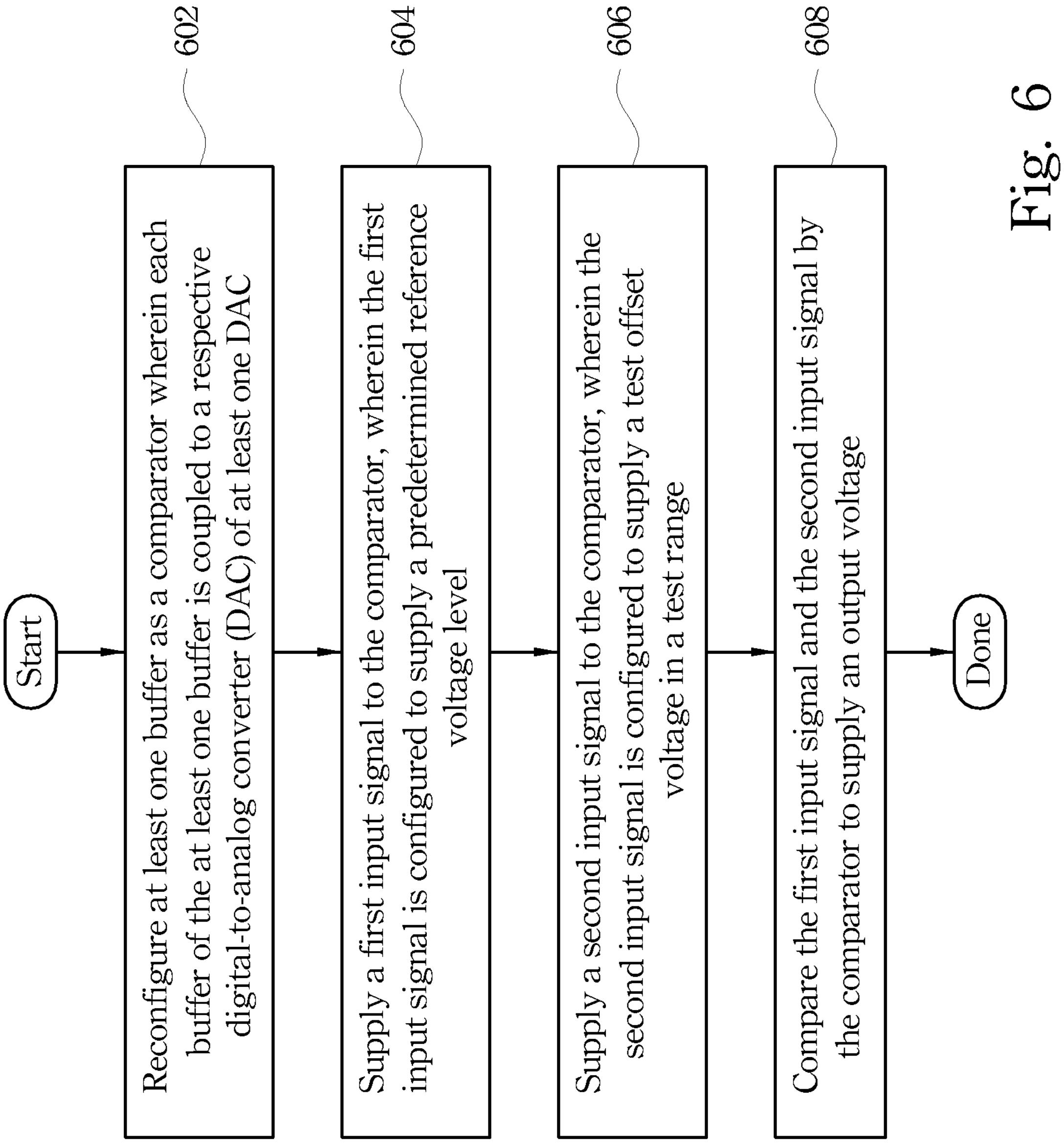
FIG. 6 is a flow diagram showing an exemplary self-test method for the liquid crystal display (LCD) source driver of FIG. 2-FIG. 5.

FIG. 6 is a flow diagram showing an exemplary self-test method for the liquid crystal display (LCD) source driver of FIG. 2-FIG. 5. At step 602, at least one buffer 104 is reconfigured as a comparator, e.g., 104*b* or 104*c*. In some embodiments, the buffer 104 is disconnected from DAC 102. At step 604, a first input signal, e.g., Vref (a predetermined test reference voltage level, e.g., one of reference values Vref 1-Vref 64) is supplied to the comparator. In some embodiments, Vref is supplied by DAC 102 to the comparator. At step 606, a second input signal, e.g., Vi, is supplied to the comparator, wherein the second input signal is configured to supply a test offset voltage, e.g., Vos or (Vdac_err+Vos), in a test range, e.g., −5 mV to 5 mV, or −10 mV to 10 mV. In some embodiments, the test offset voltage can be a maximum or minimum specification value. In some embodiments, the test offset voltage Vos or (Vdac_err+Vos) is swept from a minimum test value to the maximum test value at a fixed voltage step, e.g., 0.1 mV. At step 608, the first input signal and the second input signal are compared by the comparator to supply an output voltage V0. Further, the output voltage V0 can be determined whether it is within a pass voltage range or a fail voltage range. In some embodiments, a die (e.g., integrated circuit die) that passes the test and a die that fails can be placed in separate bins and a passed die can be put under other tests.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

The above method embodiment shows exemplary steps, but they are not necessarily required to be performed in the order shown. Steps may be added, replaced, changed order, and/or eliminated as appropriate, in accordance with the spirit and scope of embodiment of the disclosure.

Each claim of this document constitutes a separate embodiment, and embodiments that combine different claims and/or different embodiments are within scope of the disclosure and will be apparent to those skilled in the art after reviewing this disclosure. Accordingly, the scope of the disclosure should be determined with reference to the following claims, along with the full scope of equivalences to which such claims are entitled.

What is claimed is:

1. A built-in self-test (BIST) circuit for a liquid crystal display (LCD) source driver, comprising:

a plurality of digital-to-analog converters (DACs);

a plurality of buffers, wherein each buffer of the plurality of buffers is configured to be coupled to a respective DAC of the plurality of DACs and at least one buffer is reconfigurable as a comparator in response to a control signal, wherein the at least one buffer is configured to be disconnected from the DAC when the buffer is reconfigured as a comparator in a first test mode;

a first input signal node coupled to the comparator and configured to supply a first input signal that is a predetermined reference voltage level; and a second input signal node coupled to the comparator and configured to supply a second input signal that is a test offset voltage in a test range.

2. The circuit of claim 1, wherein the buffer comprises an operational amplifier (op-amp).

3. The circuit of claim 2, wherein a feedback loop from an output of the op-amp to an inverting input of the op-amp is disconnected when the buffer is reconfigured as a comparator.

4. The circuit of claim 2, wherein the first input signal node is coupled to a non-inverting input of the op-amp.

5. The circuit of claim 2, wherein the second input signal node is coupled to an inverting input of the op-amp.

6. The circuit of claim 1, wherein the test range is chosen for an offset voltage of an op-amp in the buffer.

7. The circuit of claim 1, wherein the first input signal is supplied by the DAC.

8. The circuit of claim 1, wherein the test range is chosen for a combined voltage of an offset voltage of an op-amp in the buffer and an output error of the DAC.

9. The circuit of claim 1, wherein the test offset voltage is changed between a minimum value and a maximum value in the test range at a fixed voltage step.

10. A method for using a built-in self-test (BIST) circuit for a liquid crystal display (LCD) source driver, comprising:

reconfiguring at least one buffer as a comparator using a switching element to change at least one input of the comparator in response to a control signal, wherein each buffer of the at least one buffer is configured to be coupled to a respective digital-to-analog converter (DAC) of at least one DAC, wherein the at least one buffer is configured to be disconnected from the DAC when the buffer is reconfigured as a comparator in a first test mode;

supplying a first input signal to the comparator, wherein the first input signal is a predetermined reference voltage level;

supplying a second input signal to the comparator, wherein the second input signal is a test offset voltage in a test range; and comparing the first input signal and the second input signal by the comparator to supply an output voltage.

11. The method of claim 10, further comprising determining whether the output voltage is within a pass voltage range or a fail voltage range.

12. The method of claim 10, wherein reconfiguring at least one buffer comprises disconnecting a feedback loop from an output of an op-amp in the buffer to an inverting input of the op-amp when the buffer is reconfigured as a comparator.

13. The method of claim 10, further comprising choosing the test range for an offset voltage of an op-amp in the buffer.

14. The method of claim 10, wherein the first input signal is supplied by the DAC.

15. The method of claim 10, further comprising choosing the test range for a combined voltage of an offset voltage of an op-amp in the buffer and an output error of the DAC.

16. The method of claim 10, further comprising changing the test offset voltage between a minimum value and a maximum value in the test range at a fixed voltage step.

17. A built-in self-test (BIST) circuit for a liquid crystal display (LCD) source driver, comprising:

at least one digital-to-analog converter (DAC);

at least one buffer, wherein each buffer of the at least one buffer is configured to be coupled to a respective DAC of the at least one DAC and the buffer is reconfigurable as a comparator, wherein the at least one reconfigurable buffer includes at least one switching element configured to change at least one input of the at least one reconfigurable buffer in response to a control signal, and the at least one buffer is configured to be disconnected from the DAC when the buffer is reconfigured as a comparator in a first test mode;

a first input signal node coupled to the comparator and configured to supply a first input signal that is a predetermined reference voltage level; and a second input signal node coupled to the comparator and configured to supply a second input signal that is a test offset voltage in a test range, wherein the at least one reconfigurable buffer comprises an operational amplifier (op-amp), a feedback loop to an inverting input of the op-amp is disconnected when the buffer is reconfigured as a comparator, the first input signal node is coupled to a non-inverting input of the op-amp, and the second input signal node is coupled to an inverting input of the op-amp.

18. The circuit of claim 1, wherein the at least one buffer is configured to be connected to the DAC when the buffer is reconfigured as a comparator in a second test mode.

19. The method of claim 10, wherein the at least one buffer is configured to be connected to the DAC when the buffer is reconfigured as a comparator in a second test mode.

20. The circuit of claim 17, wherein the at least one buffer is configured to be connected to the DAC when the buffer is reconfigured as a comparator in a second test mode.

* * * * *